United States Patent [19]

Mendonca et al.

[11] Patent Number: 4,749,597
[45] Date of Patent: Jun. 7, 1988

[54] PROCESS FOR CVD OF TUNGSTEN

[75] Inventors: John Mendonca, Tempe; J. B. Price, Scottsdale; Richard S. Rosler, Paradise Valley, all of Ariz.

[73] Assignee: Spectrum CVD, Inc., Phoenix, Ariz.

[21] Appl. No.: 109,635

[22] Filed: Oct. 19, 1987

[51] Int. Cl.$^4$ .............................................. C23C 16/08
[52] U.S. Cl. ..................................... 427/253; 427/255; 427/255.1; 427/383.1; 427/404
[58] Field of Search ...................... 427/253, 250, 255.1, 427/255, 255.4, 255.7, 343, 374.1, 377, 383.1, 383.3, 404, 419.7, 374.2

[56] References Cited
U.S. PATENT DOCUMENTS

| | | | |
|---|---|---|---|
| 4,349,408 | 9/1982 | Tarng et al. | 427/253 |
| 4,404,235 | 9/1983 | Tarng et al. | 427/253 |
| 4,540,607 | 9/1985 | Tsao | 427/253 |
| 4,584,207 | 4/1986 | Wilson | 427/255 |
| 4,595,608 | 6/1986 | King et al. | 427/253 |
| 4,650,698 | 3/1987 | Moriya et al. | 427/253 |

Primary Examiner—Sadie L. Childs
Attorney, Agent, or Firm—Paul F. Wille

[57] ABSTRACT

A process is disclosed for reducing lateral encroachment and silicon consumption in LPCVD of tungsten. The process comprises a low temperature deposition of a thin layer of tungsten, followed by annealing in nitrogen at high temperature, follows by deposition of a thick layer of tungsten.

8 Claims, 1 Drawing Sheet

PROCESS FOR CVD OF TUNGSTEN

BACKGROUND OF THE INVENTION

This invention relates to low pressure, chemical vapor deposition (LPCVD) of films and, in particular, of tungsten films.

In silicon semiconductor devices, contact is made to a device by a deposited metal conductor. The contact area of silicon is usually at the bottom of an opening or via. Thus, one must provide a continuous conductor over the edge of the via and down the sidewall, so-called "coverage", well as between devices.

As one produces more and more devices in a given area of silicon, all geometries must shrink, including the size of the contact area. The thicknesses of overlying layers of dielectric or conductor do not shrink, at least not proportionately. The result is a via with a smaller width to height ratio. This worsens the step coverage problem.

One solution is to selectively fill the vias with tungsten by way of an LPCVD process to provide a relatively planar surface to cover with conductor. This solution is not without difficulty since the deposition process causes the formation of volatile silicon compounds, i.e. the silicon is etched. This can cause excessive junction leakage or even shorting. In addition, the geometry of the via is altered (widened) as the silicon is consumed. The latter, etching in a direction parallel to the surface of the wafer, is referred to as lateral encroachment. The former, etching in a direction perpendicular to the surface of the wafer, is referred to as silicon consumption.

Tungsten is typically deposited at approximately 300° C. It has been reported in the literature that tungsten deposition by silicon reduction ($3Si+2WF_6 \rightarrow 2W + 3SiF_4$) is self-limiting at a thickness of about 20 nm. It is further reported that additional tungsten can be deposited without additional silicon consumption by using hydrogen reduction ($3H_2+WF_6\rightarrow W+3HF$), which is not self-limiting. At low temperatures, the deposition rate is too slow for filling deep vias, e.g. one micron or deeper. Thus, it is desirable to deposit tungsten at higher temperature, e.g. 500° C., with high partial pressure of tungsten hexafluoride, e.g. 10 mtorr, in the presence of hydrogen to achieve high growth rate. However, tungsten deposited under these conditions shows unpredictable and nonreproducible results.

In view of the foregoing, it is therefore an object of the present invention to provide an improved process for the deposition of tungsten.

Another object of the present invention is to reduce lateral encroachment in the deposition of tungsten on silicon.

A further object of the present invention is to reduce silicon consumption in the deposition of tungsten on silicon.

The foregoing objects are achieved in the present invention wherein the wafer is subjected to a low temperature deposition of tungsten by hydrogen reduction of tungsten hexafluoride. A tungsten layer approximately 200 Å thick is deposited: enough to assure complete coverage of the bottom of the via. The layer is then subjected to an anneal in a nitrogen atmosphere at a higher temperature than the deposition. The balance of the tungsten layer is then deposited, e.g. also by hydrogen reduction of tungsten hexafluoride.

BRIEF DESCRIPTION OF THE DRAWINGS

A more completed understanding of the present invention can be obtained by considering the following detailed description in conjunction with the accompanying drawings, in which.

DETAILED DESCRIPTION OF THE INVENTION

Figure 1:
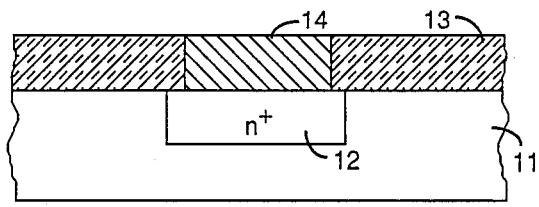
FIG. 1 illustrates a desired semiconductor structure.

FIG. 1 illustrates an idealized contact to a semiconductor device. Specifically, substrate 11, which would typically comprise P- silicon, has N+ region 12 formed therein. Overlying substrate 11 is insulating layer 13, which typically comprises silicon dioxide. An aperture is formed in layer 13 exposing at least a portion of region 12. The aperture in layer 13 is filled with tungsten to a thickness of approximately equal that of insulating layer 13. Tungsten layer 14 forms a low resistance contact to N+ region 12. As previously noted, FIG. 1 represent a goal rather than a realizable device. The tungsten deposition process has side effects, most of which are undesirable.

Figure 2:
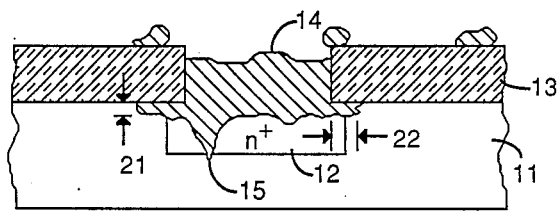
FIG. 2 illustrates the problems of encroachment and consumption in prior art structures.

FIG. 2 illustrates a device as obtained using prior art processes, with some exaggeration of the difficulties encountered. Specifically, tungsten layer 14 is deposited mostly within the aperture defined by insulating layer 13, but not exclusively. Particles of tungsten are deposited elsewhere, for example, on layer 13, producing what are known as "sparkles" addition, for reasons not fully understood, the tungsten layer may grow into substrate 11 forming a spike such as spike 15. As previously noted, this growth is part of the silicon consumption phenomena. More typically, the growth is less, as indicated by dimension 21. The tungsten layer grows laterally, producing the problem of encroachment as indicated by dimension 22. Assuming no spikes, the consumption and encroachment typically expand the tungsten layer 50 to 300 nm. beyond the intended silicon/tungsten boundary. Since region 12 typically has a thickness of 100-200 nm. in 256K DRAM devices or a thickness of around 50 nm. for 4-16 M DRAM devices, encroachment and consumption are serious problems. Spikes, such as spike 15, or encroachment to the extent indicated in FIG. 2 results in a shorted junction and an inoperative device or a junction so leaky that the device is ineffective.

Figure 3:
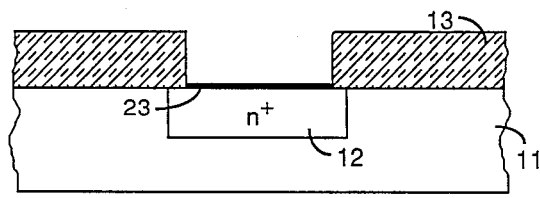
FIG. 3 illustrates the first step of the present invention.

FIG. 3 illustrates a first step of the process in accordance with the present invention wherein a thin tungsten layer is deposited using a low pressure CVD process. The tungsten layer is formed mainly by the silicon reduction of tungsten hexafluoride and produces a layer having a thickness of approximately 20 nm. This depth is sufficient to assure that the entire surface of region 12 is covered and to impede any diffusion of tungsten hexafluoride during later processing. Layer 23 is then subjected to a nitrogen atmosphere at a temperature of about 650° C. This nitriding of the tungsten layer has been found to form a barrier to silicon consumption but without impeding the ability of further tungsten to adhere to the initially deposited layer.

Figure 4:
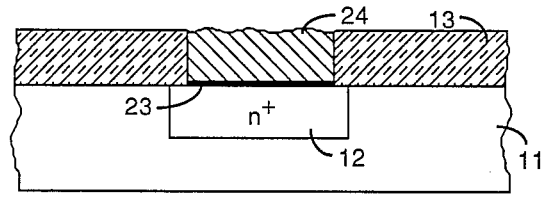
FIG. 4 illustrates the last step of the present invention.

Following the nitriding step, a tungsten layer is formed as desired, preferably by the hydrogen reduction of tungsten hexafluoride. The thickness of the subsequent tungsten layer, represented by layer 24 in FIG. 4 depends upon the particular application for the contact. A typical thickness for layer 24 is 500–1000 nm.

Between the initial deposition and the nitriding steps and between the nitriding and final deposition, the wafer is cooled. As presently implemented, this is accomplished by transporting the wafer to a load lock, opening the load lock to ambient air, and returning the wafer to the deposition chamber. Because of being transported, the actual wafer temperature upon return to the deposition chamber is not known. Transporting the wafer to the cooler load lock, but without exposure to atmosphere, produces nearly as good a result.

As a particular example of the present invention, layer 23 is formed utilizing a gas mixture comprising 40 SCCM of hydrogen and 1 SCCM of tungsten hexafluoride at 50–100 mtorr for 40 sec with the wafer heated to a temperature of 420° C. The gas mixture is then changed to nitrogen at a pressure equal to or greater than 500 torr for 300 seconds at 650° C. After annealing, the gas mixture is switched to 40 SCCM hydrogen and 4 SCCM tungsten hexafluoride at 90–130 mtorr for 240 seconds at 630° C.

In an implementation of the process described above, the silicon consumption amounted to 38 nm. and the lateral encroachment was less than 20 nm. As known by those of skill in the art, these dimensions are difficult to ascertain since they are close to the resolution limits of the analytical equipment. Based on these and other experiments, it is believed that temperature is the most important parameter and should be held to between 370° C. and 450° C. for initial deposition and between 550° C. and 700° C. for the nitrogen anneal. The layer thus formed acts as diffusion barrier and controls silicon migration for the subsequent deposition of a thick tungsten layer, the parameters for which are less critical due, in part, to the benefits of the present invention.

There is thus provided by the present invention an improved process for forming contacts in vias and providing a relatively planar surface for conductive runs on an integrated circuit. A barrier is formed which enables one to obtain relatively thick deposits of tungsten using the inherent selectively of chemical vapor deposition. The barrier controls both consumption and encroachment and is formed in a process sequence which does not require handling of the wafer nor subjecting the wafer to temperatures which will alter previously formed structures.

Having thus described the present invention it will be apparent to those of skill in the art that various modifications can be made within the spirit and scope of the present invention. For example, other gas mixtures may be used in the formation of the thin tungsten layer, such as tungsten hexafluoride and argon or tungsten hexafluoride and nitrogen, with or without the ue of RF plasma. Similarly, other wafer cooling techniques can be employed, depending upon the equipment used, e.g. a cooled, thermally conductive wafer chuck would enable one to leave the wafer within the deposition chamber. The annealing time is not critical, but should be longer than approximately thirty seconds, depending upon wafer temperature and the partial pressure of the nitrogen. Annealing times of sixty seconds have been used successfully.

We claim:

1. A process for depositing tungsten layer on silicon comprising the steps of:
    depositing a portion of said layer on said siliconfrom a gas mixture comprising tungsten hexafluo;
    annealing said portion of said layer in a nitrogen bearing atmosphere at a temperature less than 700° C.; and
    depositing the remainder of said layer from a gas mixture.

2. The process as set forth in claim 1 wherein said portion is deposited by
    providing a gas mixture comprising hydrogen and tungsten hexafluoride at a pressure of 50–100 mtorr; and
    heating said silicon to a temperature of less than 450° C. in the presence of said gas mixture.

3. The process as set forth in claim 2 wherein said heating step is continued for 30–60 seconds.

4. The process as set forth in claim 1 wherein said annealing step is carried out at a pressure greater than 500 torr.

5. The process as set forth in claim 4 wherein said annealing step is continued for at least 60 seconds.

6. The process as set forth in claim 1 and further comprising the step of cooling the silicon after said annealing step.

7. The process as set forth in claim 6 and further comprising the step of cooling the silicon prior to said annealing step.

8. The process as set forth in claim 7 wherein said cooling steps each comprise exposing said silicon to atmosphere.

* * * * *

UNITED STATES PATENT AND TRADEMARK OFFICE
CERTIFICATE OF CORRECTION

PATENT NO. : 4,749,597

DATED : June 7, 1988

INVENTOR(S) : Mendonca et al.

It is certified that error appears in the above-identified patent and that said Letters Patent is hereby corrected as shown below:

Column 4, line 9, change "ue" to --use--.

Claim 1, column 4, line 22, change "siliconfrom" to --silicon from--.

Claim 1, column 4, line 23, change "hexafluo" to --hexafluoride--.

Signed and Sealed this

Fourth Day of October, 1988

Attest:

DONALD J. QUIGG

Attesting Officer      Commissioner of Patents and Trademarks